United States Patent
Hwang et al.

(10) Patent No.: US 11,435,790 B2
(45) Date of Patent: Sep. 6, 2022

(54) DISPLAY DEVICE

(71) Applicant: LG DISPLAY CO., LTD., Seoul (KR)

(72) Inventors: Hak-Mo Hwang, Seoul (KR); Se-Eun Kim, Seoul (KR); Gyung-Bo Ha, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 27 days.

(21) Appl. No.: 16/997,140

(22) Filed: Aug. 19, 2020

(65) Prior Publication Data

US 2021/0064100 A1 Mar. 4, 2021

(30) Foreign Application Priority Data

Sep. 2, 2019 (KR) .................. 10-2019-0108069

(51) Int. Cl.
*H05K 5/00* (2006.01)
*G06F 1/18* (2006.01)
*G02F 1/1333* (2006.01)
*H01L 51/00* (2006.01)

(52) U.S. Cl.
CPC .............. *G06F 1/181* (2013.01); *G06F 1/189* (2013.01); *G02F 1/133305* (2013.01); *H01L 51/0097* (2013.01)

(58) Field of Classification Search
CPC ....................................................... H05K 5/00
See application file for complete search history.

(56) References Cited

U.S. PATENT DOCUMENTS 10,845,634 B1 * 11/2020 Chung .............. G02F 1/133308

FOREIGN PATENT DOCUMENTS

CN 104373864 A * 2/2015 .............. F21V 21/00
KR 10-2017-0050512 A 5/2017

* cited by examiner

*Primary Examiner* — Jerry Wu
(74) *Attorney, Agent, or Firm* — Birch, Stewart, Kolasch & Birch, LLP

(57) ABSTRACT

A display device is provided. The display device includes a display panel, an inner plate disposed at a rear surface of the display panel, and a back cover disposed at a rear surface of the inner plate. The back cover includes a first plate disposed at the rear surface of the inner plate, a second plate spaced apart from the first plate so that the second plate faces the first plate, and a plurality of first connectors connecting the first plate and the second plate.

11 Claims, 17 Drawing Sheets

DISPLAY DEVICE

CROSS-REFERENCE TO RELATED APPLICATIONS

This application claims the priority benefit of the Korean Patent Application No. 10-2019-0108069 filed in the Republic of Korea on Sep. 2, 2019, all of which are hereby expressly incorporated by reference as if fully set forth herein into the present application.

BACKGROUND OF THE INVENTION

Field of the Invention

The present disclosure relates to a display device, and more particularly to a display device having a slim flat structure through coupling of a display panel and a back cover.

Discussion of the Related Art

An image display, which renders a variety of information on a screen, is a core technology of the information age. Such an image display is developing to achieve enhanced thinness, enhanced lightness, and enhanced performance. In connection with this, as a flat display capable of eliminating disadvantages of heavy and bulky structures of cathode ray tubes (CRTs), a liquid crystal display capable of rendering an image using light supplied from a light source, an organic light emitting display capable of emitting light in a self-luminous manner, thereby eliminating a light source unit, or the like is highlighted.

In such a display, a plurality of pixels is arranged in a matrix and, as such, displays an image. In this case, each pixel includes a light emitting element, and a pixel driving circuit constituted by a plurality of transistors configured to independently drive the light emitting element.

Recently, active research on a thin and light display panel is being conducted. In addition, a display device including a bendable or foldable display panel has also been supplied.

However, as such a display device has an increasing tendency toward miniaturization and thinness, a back cover made of a glass material is applied to the display device to secure rigidity. For this reason, there can be problems of an increase in weight, an increase in costs caused by the weight increase, and degraded handling ability caused by the weight increase.

SUMMARY OF THE INVENTION

Accordingly, the present disclosure is directed to a display device that substantially obviates one or more problems due to limitations and disadvantages of the related art.

An object of the present invention is to provide a display device capable of achieving a reduction in weight, easy extension to a multi-display device, and an increase in rigidity while achieving lightness through application of a back cover made of a plastic material to a rear surface of a display panel.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, a display device includes a display panel, an inner plate disposed at a rear surface of the display panel, and a back cover disposed at a rear surface of the inner plate, wherein the back cover includes a first plate disposed at the rear surface of the inner plate, a second plate spaced apart from the first plate such that the second plate faces the first plate, and a plurality of first connectors connecting the first plate and the second plate.

The back cover can include a second connector for connecting the first plate and the second plate or connecting the first connectors, and can be formed through extrusion such that the first plate, the second plate, the first connectors and the second connector are integrally formed.

The first connectors and the second connector can be connected by at least one or a plurality of patterns having at least one structure of "I", "H", "N", "V", "X" or a honeycomb between the first plate and the second plate.

The back cover can include an extension extending from one end of the back cover along a side surface of the display panel.

The back cover can include first and second back covers coupled to each other in a horizontal direction. The first back cover can be provided with a protrusion protruding from one lateral end thereof. The second back cover can be formed with a groove at one lateral end thereof facing the lateral end of the first back cover such that the protrusion is coupled to the groove.

The back cover can include first and second back covers coupled to each other in a horizontal direction. The first back cover can be provided with a first protrusion at one end of a rear surface thereof. The second back cover can be provided with a second protrusion at one end of a rear surface thereof such that the second protrusion faces the first protrusion. The back cover can further include a fastener for simultaneously fastening the first protrusion and the second protrusion.

The display device can further include a side panel configured to cover an outer end of the back cover and an outer end of the display panel.

The side panel can include a first panel disposed at side surfaces of the back cover and the display panel, and a second panel disposed between the display panel and the back cover while protruding from the first panel.

The side panel can include a coupler protruding from the first panel such that the coupler is inserted into a fixing hole formed at one of the first connectors, and a coupling head formed at an end of the coupler to have a greater size than the fixing hole.

The back cover can include a reinforcing bar disposed in a hollow hole formed between adjacent ones of the first connectors and between the first plate and the second plate.

The back cover can include a circuit unit installation area from which the second plate and a part of the first connectors are removed, in order to enable a circuit unit of the display panel to be coupled to a rear surface of the first plate.

The display device can further include a cover shield coupled to a rear surface of the back cover to cover the circuit unit installation area.

The circuit unit can be coupled to a fastener extending through the first plate at the rear surface of the inner plate.

In accordance with the display device of the present invention, the following effects and advantages can be provided.

First, it can be possible to embody a display device having a light and thin structure through application of the back cover formed through plastic extrusion.

Second, the reinforcing bar can be provided in the hollow hole of the back cover and, as such, additional rigidity enhancement can be achieved.

Third, as a fastening structure can be applied between back covers, a multi-display device can be realized.

Fourth, through improvement of a coupling structure of the side panel, there is an effect of enhancing assemblability.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE EMBODIMENTS

Figure 1:
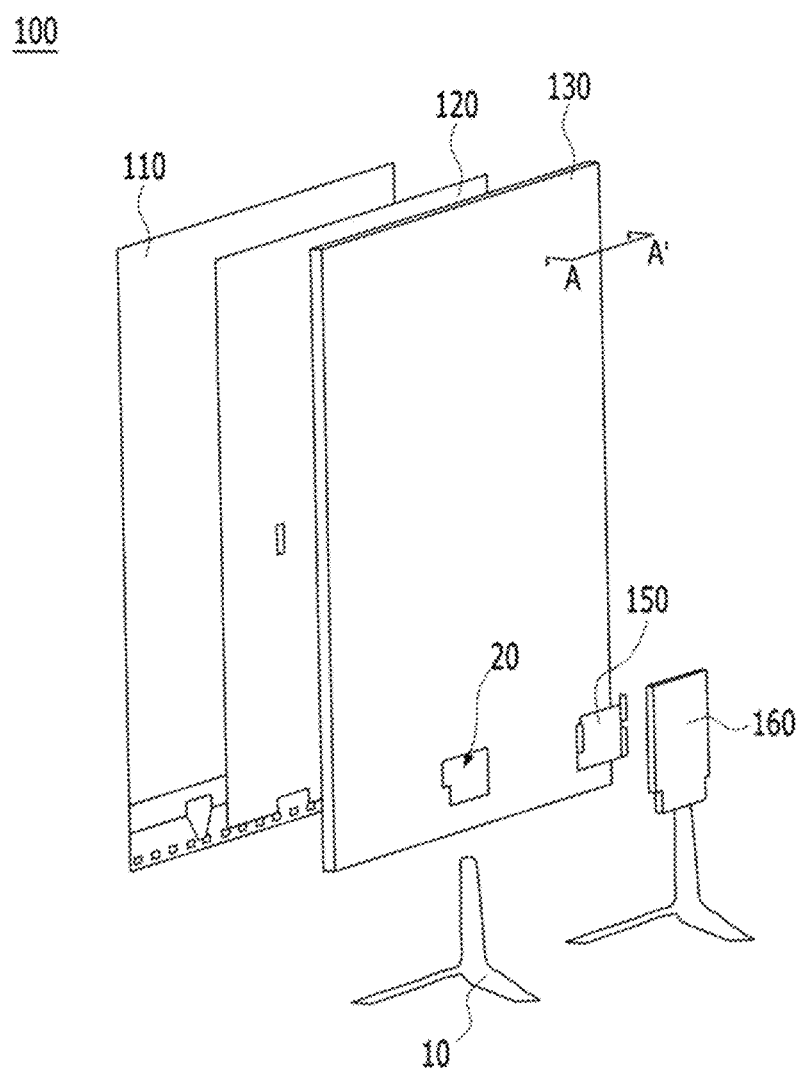
FIG. 1 is an exploded perspective view illustrating a display device according to an exemplary embodiment of the present invention.

Hereinafter, preferred embodiments of the present invention will be described in detail with reference to the accompanying drawings in order to enable those skilled in the art to easily implement embodiments of the present invention. In adding reference numerals for elements in each drawing, it should be noted that like reference numerals already used to denote like elements in other drawings are used for elements wherever possible. In describing the present invention, when the detailed description of the relevant known function or configuration is determined to unnecessarily obscure the gist of the present invention, the detailed description will be omitted. In addition, some features shown in the drawings are exaggerated, reduced, or simplified for clarity and convenience of illustration. The drawings and constituent elements shown therein are not necessarily drawn to scale. Of course, those skilled in the art can easily appreciate such detailed matters.

In the present disclosure, the term "display device" can be used, in a narrow sense, to encompass a display device, such as a liquid crystal display module (LCM) or an organic light-emitting display module (OLED module), that includes a display panel and a driving unit for driving the display panel. Further, the term "display device" can be used to further encompass a set device (or a set apparatus) or a set electronic device, such as a notebook computer, a television, a computer monitor, an equipment display including an automotive display or a display of another type for vehicles, or a mobile electronic device, such as a smartphone or an electronic pad, which is a complete product (or a final product) including an LCM or an OLED module.

FIG. 1 is an exploded perspective view illustrating a display device according to an exemplary embodiment of the present invention. All the components of the display device according to all embodiments of the present invention are operatively coupled and configured.

Referring to FIG. 1, a display device 100 according to an exemplary embodiment of the present invention includes a display panel 110 for displaying an image, and an inner plate 120 and a back cover 130, which are disposed at a rear surface of the display panel 100.

The display panel 110 can be a flexible display panel which is bendable or foldable by itself. Alternatively, the display panel 110 can be a rigid flat display panel which has a rigid flat structure having difficulty being deformed by external force.

When the display panel 110 is a flexible display panel which is bendable or foldable, the display panel 110 can be embodied as an organic light emitting display (OLED), an electrophoretic display, an electrochromic display (ECD) or the like.

For example, when the display panel 110 is an LCD panel, the display panel 110 includes a plurality of gate lines, a plurality of data lines, and pixels formed in areas where the gate lines and the data lines intersect with each other, respectively. In addition, the display panel 110 can include an array substrate including thin film transistors which are switching elements for adjusting light transmittance in respective pixels, an upper substrate including a color filter and/or a black matrix, etc., and a liquid crystal layer formed between the array substrate and the upper substrate.

On the other hand, when the display panel 110 is an OLED panel, the display panel 110 can include a plurality of gate lines, a plurality of data lines, and pixels formed in areas where the gate lines and the data lines intersect with each other, respectively. In addition, the display panel 110 can include an array substrate including thin film transistors as elements for selectively applying voltages to respective pixels, an OLED layer disposed on the array substrate, and a sealed substrate, an encapsulation substrate or the like disposed on the array substrate to cover the OLED layer. The encapsulation substrate can protect the thin film transistors and the OLED layer from external impact, and can prevent moisture or oxygen from penetrating the OLED layer.

A layer formed on the array substrate can include an inorganic light emitting layer, for example, a nano-material layer or quantum dots.

The following description will be given in conjunction with an example in which an OLED panel is applied to the display panel 110. Of course, embodiments of the present invention are not limited to such an example. For example, a quantum dot light emitting display panel or an inorganic OLED panel of an OLED display can be applied to the display panel 110.

The display panel 110 can include a display area for displaying a screen, and a non-display area disposed adjacent to the display area. For example, the display panel 110 can include a display area for displaying a screen, and a non-display area disposed to surround the display area.

A touch film can be provided at an upper surface of the display panel 110. The touch film can be attached to the display panel by an adhesive layer. As the adhesive layer, a sticky adhesive such as an optically clear adhesive (OCA) can be applied. In addition, a cover window, a protective film, an optical sheet, etc. can be additionally provided at an upper surface of the touch film. For example, the cover window can be made of a plastic material having flexibility. In this case, the material of the cover window can include polyimide (PI), polyethylene terephthalate (PET), polyethylene naphthalate (PEN), polycarbonate (PC), polyethersulfone (PES), polyarylate (PAR), polysulfone (PSF), cyclic-olefin copolymer (COC), or the like.

Meanwhile, the inner plate 120 has a thin plate structure made of metal and, as such, enhances heat dissipation performance. For example, the inner plate 120 can be made of aluminum. Of course, the material of the inner plate 120 is not limited to such a material. The inner plate 120 can be attached to the display panel 110 by a double-sided tape or a foam tape, and can be attached to the back cover 130 by a double-sided tape or through bonding.

In addition, the inner plate 120 can prevent the rear surface of the display panel 110 from being viewed. For example, the inner plate 120 can prevent structures of wires or electronic components disposed at the rear surface of the display panel 110 from being viewed in a state in which the display panel 110 is turned off.

Furthermore, the back cover 130 can be embodied using a plastic material having a considerably small weight, as compared to existing cases in which the back cover is embodied using metal or glass. For example, the back cover 130 can be manufactured to have an extruded plastic structure having hollow holes, substantially similarly to a corrugated cardboard structure. As the material of the back cover 130, a plastic composite sheet can be applied.

The display device illustrated in FIG. 1 will be described in conjunction with, for example, a TV which is used in a vertically upright and held state. Supports 10 can be provided at a lower portion of the display device in order to enable the display device to be held in a vertically upright state. Alternatively, the display device can be applied as a wall-mounted type without using the supports 10.

A circuit unit installation area 20, a circuit unit 150, and a cover shield 160, which have not been described with reference to FIG. 1, will be described later.

Figure 2:
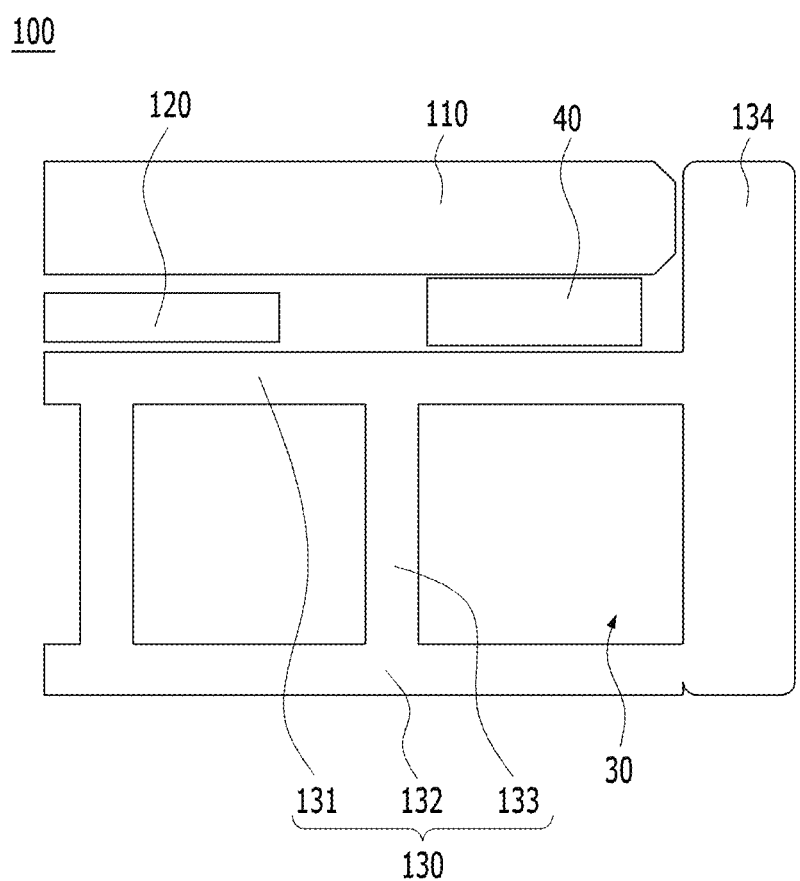
FIG. 2 is a cross-sectional view taken along line A-A' in FIG. 1, illustrating a first embodiment of a back cover in the display device shown in FIG. 1.

FIG. 2 is a cross-sectional view taken along line A-A' in FIG. 1, illustrating a first embodiment of the back cover in the display device shown in FIG. 1. In the following description, reference numerals identical to the above-described reference numerals designate the same constituent elements as those of the above-described reference numerals.

Referring to FIG. 2, the display device 100 according to the first embodiment of the present invention includes a display panel 110, an inner plate 120, and a back cover 130.

In this case, the back cover 130 includes a first plate 131, a second plate 132, and first connectors 133.

The first plate 131 is disposed at a rear surface of the inner plate 120, whereas the second plate 132 is disposed to be spaced apart from the first plate 131 such that the second plate 132 faces the first plate 131. The first connectors 133 connect the first plate 131 and the second plate 132. The first plate 131, the second plate 132, and the first connectors 133 can be integrally formed in a plastic extrusion molding procedure for the back cover 130. Accordingly, the back cover 130 can have a small weight while having high rigidity as compared to weight. The back cover 130 can be formed with hollow holes 30 among the first plate 131, the second plate 132 and the first connectors 133.

The back cover 130 can provide characteristics associated with heat dissipation or rigidity of the display panel 110 in an extrusion direction. For example, when the display device 100 has a TV structure, which is long in a horizontal direction and is upright in a vertical direction, it can be possible to enhance rigidity in the horizontal direction, that is, a longitudinal direction, by extruding the back cover 130 such that the first connectors 133 are formed in the horizontal direction. When the back cover 130 is formed through extrusion such that the first connectors 133 are formed in the vertical direction, heat can be dissipated in the vertical direction through convection and, as such, heat dissipation performance can be enhanced. In connection with this, detailed experimental results will be described later.

The back cover 130 includes an extension 134 at one end thereof. The extension 134 can be disposed in parallel to the first connectors 133 or in a vertical direction. The extension 134 extends to connect ends of the first and second plates 131 and 132, and further extends along a side surface of the display panel 110. Accordingly, the extension 134 can function as a finishing member while protecting corner portions of both the display panel 110 and the back cover 130 without requiring an additional structure such as a separate guide panel. The extension 134 can also be formed in the extrusion molding procedure for the back cover 130, simultaneously with the back cover 130. Accordingly, there are advantages of simplification of an assembly process and a reduction in the number of constituent elements.

Figure 3A:
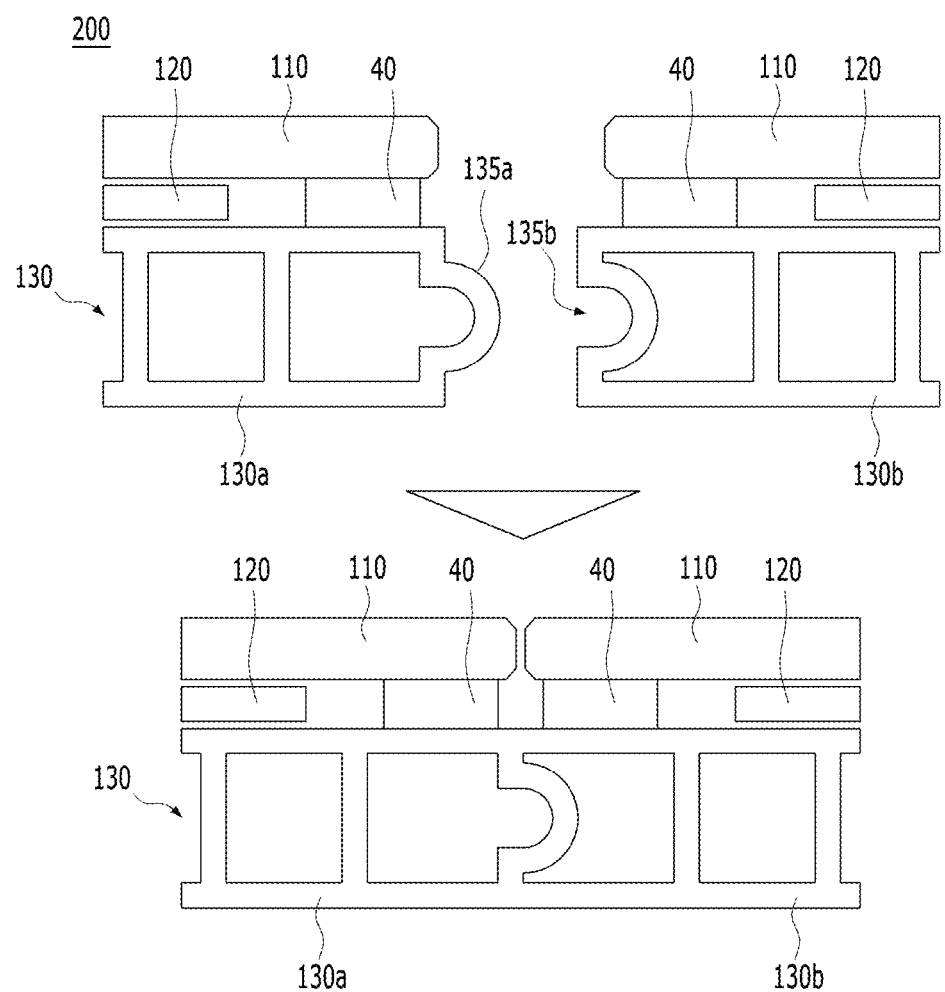
FIGS. 3A and 3B are cross-sectional views taken along line A-A' in FIG. 1, illustrating a second embodiment of the back cover in the display device shown in FIG. 1.
Figure 3B:
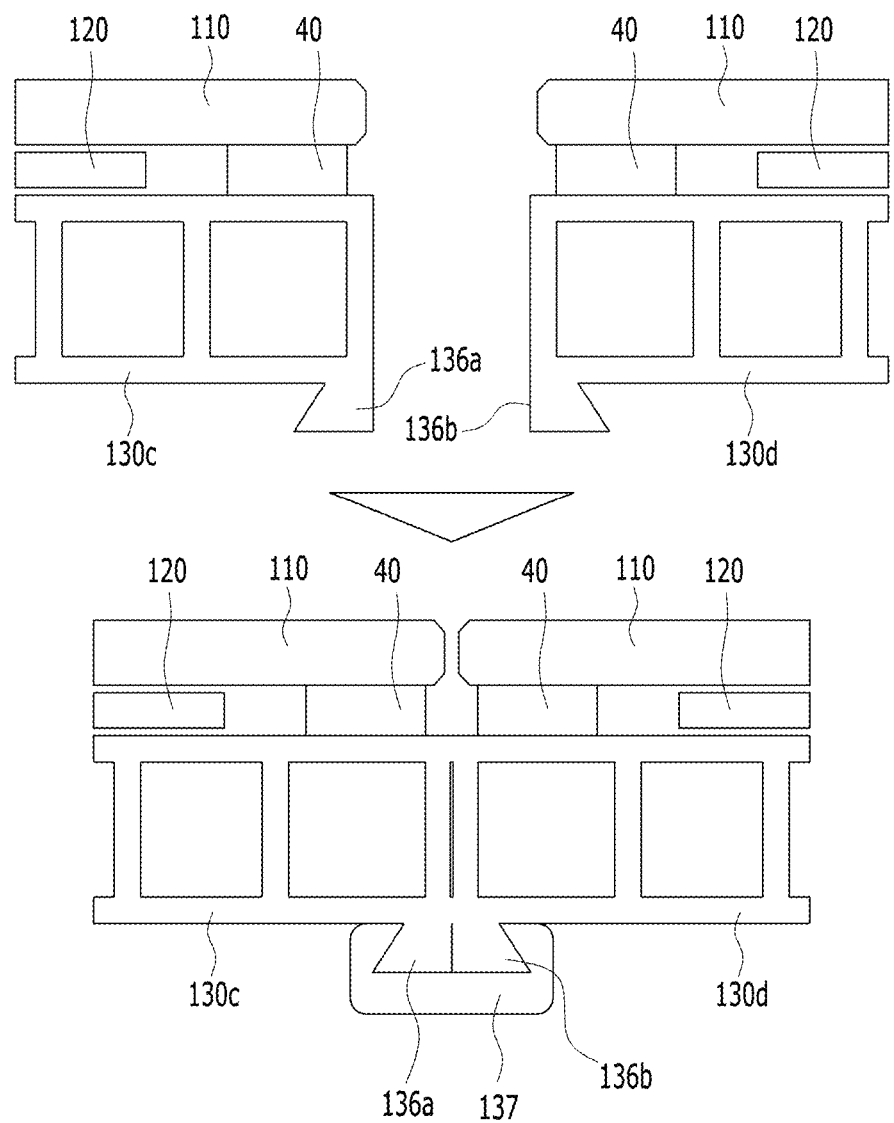

FIGS. 3A and 3B are cross-sectional views taken along line A-A' in FIG. 1, illustrating a second embodiment of the back cover in the display device shown in FIG. 1.

Referring to FIG. 3A, a display device 200 according to an exemplary embodiment of the present invention includes display panels 110, inner plates 120, and a back cover 130. In this case, the back cover 130 includes a first back cover 130a and a second back cover 130b, which are disposed in parallel in a horizontal direction, and, as such, can provide a structure in which the first back cover 130a and a second back cover 130b are coupled to each other such that edges of the display panels 110 contact each other. For example, the display device can be embodied as a multi-display device configured through connection of a plurality of display panels 110.

The first back cover 130a is formed with a protrusion 135a at one lateral end thereof facing the second back cover 130b, whereas the second back cover 130b is formed with a groove 135b at one lateral end thereof facing the first back cover 130a. Accordingly, as the protrusion 135a and the groove 135b are coupled to each other, the first back cover 130a and the second back cover 130b are coupled to each other and, as such, the multi-display device 200 can be embodied. For example, when the second back cover 130b is coupled to one side of the first back cover 130a, and a third back cover and a fourth back cover, which are coupled to each other, are coupled to lower sides of the first and second back covers 130a and 130b, respectively, four display panels are disposed in a coupled state and, as such, the resultant display device can be used as a large-size display device. Since the display panels 110 are disposed to be in contact with one another or are disposed adjacent to one another in the multi-display device 200 as described above, the bezel area of the multi-display device 200 can be minimized and as such, sense of unity can be obtained. Furthermore, there is an effect capable of providing a large-size display device using considerably reduced costs, as compared to costs taken to manufacture a large-size display panel.

Referring to FIG. 3B, the back cover 130 includes a first back cover 130c provided with a first protrusion 136a at one end of a rear surface thereof, and a second back cover 130d provided with a second protrusion 136b at one end of a rear surface thereof such that the second protrusion 136b faces the first protrusion 136a. The first protrusion 136a and the second protrusion 136b can be coupled to each other by a fastener 137 configured to simultaneously fasten the first protrusion 136a and the second protrusion 136b. Although not shown, the first protrusion 136a and the second protrusion 136b can be formed to extend lengthily along edges of corresponding ones of the back covers 130c and 130d, respectively. The fastener 137 can couple the first protrusion 136a and 136b in a sliding-fit manner or in an interference-fit manner. As the display panels 110 are coupled in a horizontal direction or a vertical direction by the fastener 137 at the rear surfaces of the plurality of back covers 130c and 130d in accordance with the above-described structure, the display device 200 can be embodied as a multi-display device.

Of course, in addition to the coupling structure using the protrusion and the groove and the coupling structure using the protrusions and the fastener, a plurality of back cover coupling structures to which the above-described coupling structure is applied can be used.

Figure 4A:
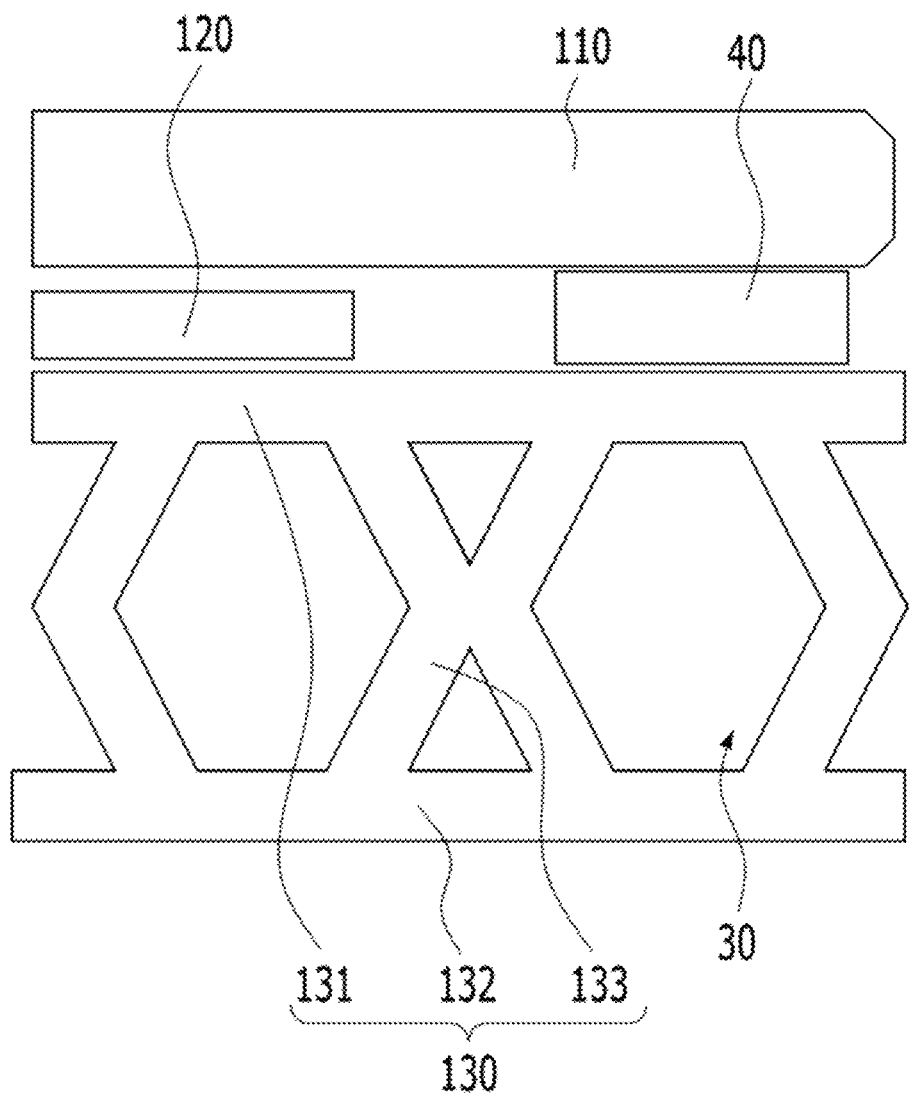
FIGS. 4A and 4B are reference views illustrating back cover structures of the display device shown in FIG. 1.
Figure 4B:
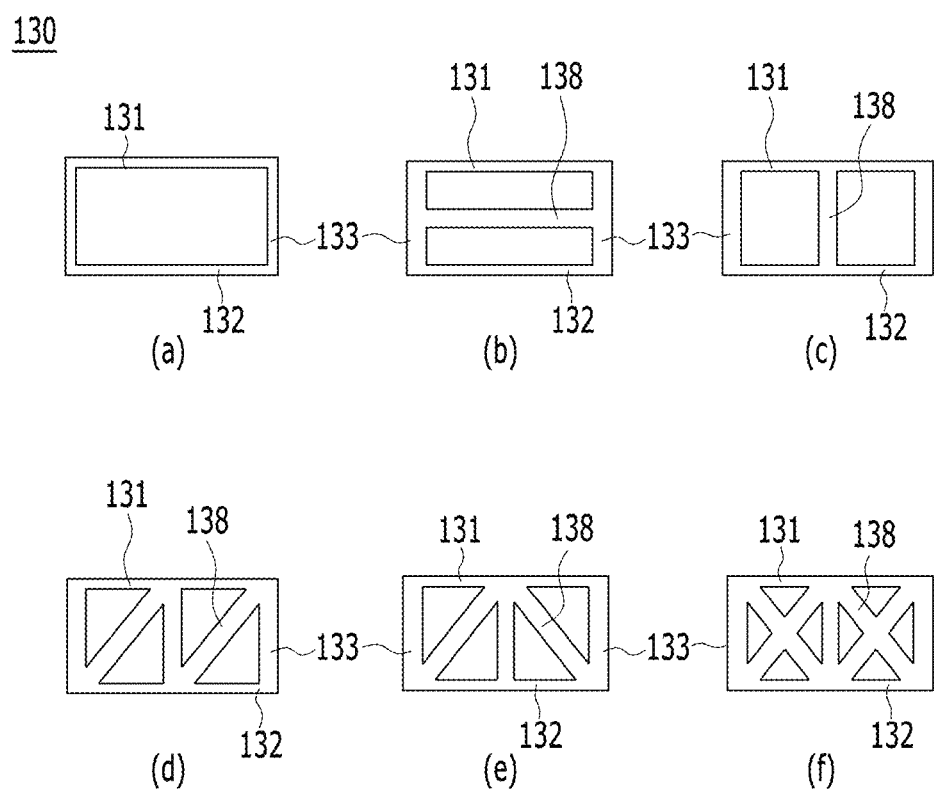

FIG. 4A is a cross-sectional view illustrating an example in which the connector of the back cover has a structure different from the above-described structure. FIG. 4B is a reference view illustrating various back cover structures of the display device shown in FIG. 4A.

Referring to FIG. 4A, the back cover 130 of a display device according to an exemplary embodiment of the present invention includes a first plate 131, a second plate 132, and first connectors 133.

The structure of the first connectors 133 connecting the first plate 131 and the second plate 132 can be formed in the form of lines connecting the first and second plates 131 and 132 while having a minimum length between the first and second plates 131 and 132, as shown in FIG. 2, or can be formed in the form of a honeycomb structure, as shown in FIG. 4A. The first connectors 133, which have a honeycomb structure, can have an effect of enhancing rigidity in order to more firmly support the first and second plates 131 and 132 between the first and second plates 131 and 132. Although not shown, the first connectors 133 connecting the first and second plates 131 and 132 can form a structure having a circular cross-section, an oval cross-section, or a polygonal cross-section.

In addition, separately from the first connectors 133 as first connectors, a second connector 138 can be provided inside the back cover 130. FIG. 4B is a cross-sectional view illustrating various embodiments of the second connector provided inside the back cover. Referring to FIG. 4B, the second connector 138 is provided inside the back cover 130 in addition to the first connectors 133 connecting the first and second plates 131 and 132.

FIG. 4B(a) illustrates the case in which only the first connectors 133 are provided between the first plate 131 and the second plate 132. FIG. 4B(b) illustrates a second connector 138 connecting centers of adjacent ones of the first connectors 133. FIG. 4B(c) illustrates a second connector 138 disposed in parallel to the first and second plates 131 and 132 between the first plate 131 and the second plate 132. FIG. 4B(d) illustrates a second connector 138 connecting, in a diagonal direction, a corner of one of the adjacent first connectors 133 and another corner of the other first connector 133 facing the corner of the one first connector 133 in the diagonal direction between the first plate 131 and the second plate 132. FIG. 4B(e) illustrates a structure similar to the structure of FIG. 4B(d). In the structure of FIG. 4B(e), second connectors 138 extend in different diagonal directions to connect adjacent ones of the first connectors 133 in different diagonal directions. Finally, FIG. 4B(f) illustrates second connectors 138 connecting adjacent ones of the first connectors 133 in the form of an X shape between the first plate 131 and the second plate 132. Thus, the first and second plates 131 and 132 in the back cover 130 can be connected by a pattern of the first connectors 133 or the second connectors 138 having at least one structure of "I", "H", "N", "X" or a honeycomb between the first plate 131 and the second plate 132.

The back cover 130 can be formed in such a manner that the first plate 131, the second plate 132, the first connectors 133 and the second connectors 138 are integrally formed through extrusion molding.

In the following description, the display device 100 according to the exemplary embodiment of the present invention will be described in conjunction with an example in which, among various structures of the first and second connectors 133 and 138 as described above, the honeycomb structure is applied to the first connectors 133.

Figure 5:
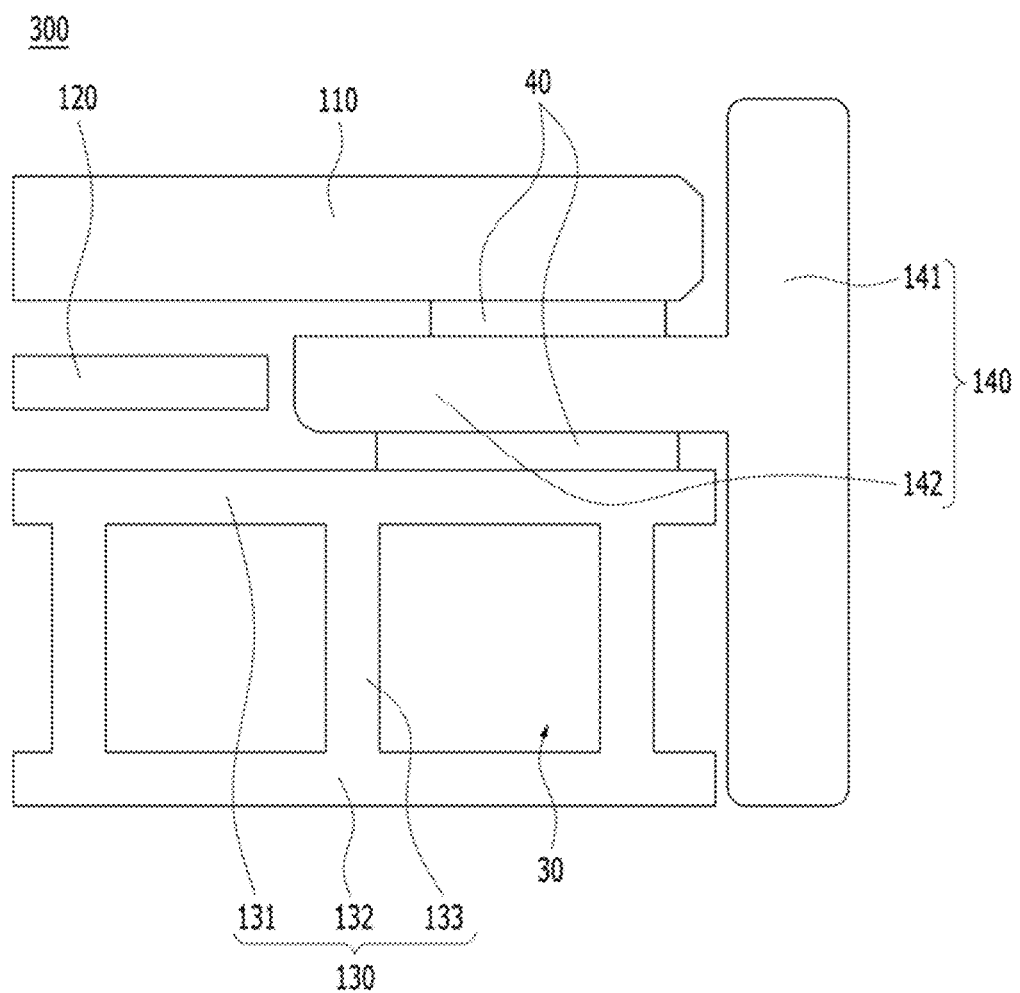
FIG. 5 is a cross-sectional view taken along line A-A' in FIG. 1, illustrating a third embodiment of the back cover in the display device shown in FIG. 1.

FIG. 5 is a cross-sectional view taken along line A-A' in FIG. 1, illustrating a third embodiment of the back cover in the display device shown in FIG. 1.

Referring to FIG. 5, a display device 300 according to the third embodiment of the present invention includes a display panel 110, an inner plate 120, a back cover 130, and a side panel 140.

In this case, the back cover 130 includes a first plate 131, a second plate 132, and first connectors 133.

The side panel 140 is disposed at ends of the display panel 110 and the back cover 130. The side panel 140 can be disposed to surround side surfaces of the display panel 110 and the back cover 130. When the display panel 110 has, for example, a quadrangular shape, the side panel 140 can have an integrated structure coupled to the display panel 110 and the back cover 130 while surrounding four side surfaces of the display panel 110 and four side surfaces of the back cover 130.

The side panel 140 includes a first panel 141 for covering outer ends of the display panel 110 and the back cover 130, and a second panel 142 protruding from the first panel 141 such that the second panel 142 is inserted between the display panel 110 and the back cover 130.

The side panel 140 can be laid on an upper surface edge of the back cover 130, and can then be coupled to the upper surface edge by a double-sided tape 40 or in a bonding manner. In this case, a rear surface of the second panel 142 is coupled to the upper surface edge of the back cover 130. A rear surface edge of the display panel 110 can be coupled to an upper surface of the second panel 142 by a double-sided tape or in a bonding manner.

The side panel 140 provides side finishing while protecting edges of the display panel 110 and the back cover 130. The side panel 140 can also function to support the display panel 110 in a state of being disposed on the back cover 130. The side panel 140 can be made of plastic or metal. The appearance design or color of the side panel 140 can be selectively applied.

Figure 6:
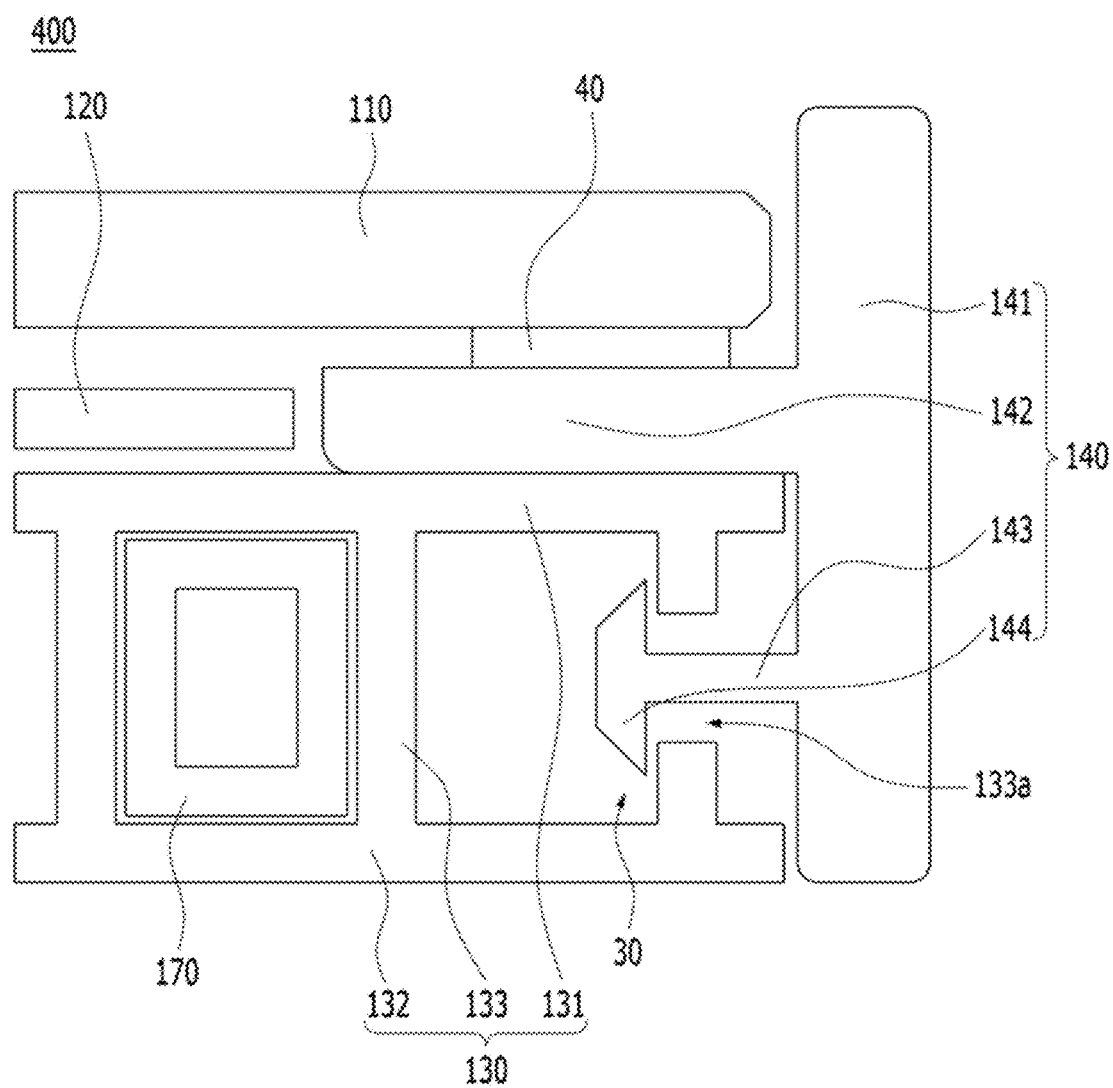
FIG. 6 is a cross-sectional view taken along line A-A' in FIG. 1, illustrating a fourth embodiment of the back cover in the display device shown in FIG. 1.

FIG. 6 is a cross-sectional view taken along line A-A' in FIG. 1, illustrating a fourth embodiment of the back cover in the display device shown in FIG. 1.

Referring to FIG. 6, a display device 400 according to the fourth embodiment of the present invention includes a display panel 110, an inner plate 120, a back cover 130, and a side panel 140.

The back cover 130 includes a first plate 131, a second plate 132, and first connectors 133.

The side panel 140 includes a first panel 141 for covering outer ends of the display panel 110 and the back cover 130, a second panel 142 protruding from the first panel 141 such that the second panel 142 is inserted between the display panel 110 and the back cover 130, and a coupler 143 protruding from the first panel 141 such that the coupler 143 is inserted into a fixing hole 133a formed at the connector 133 disposed adjacent to the side panel 140.

In this embodiment, the side panel 140 can be coupled to each side surface of the display panel 110 or the back cover 130. For example, when the display panel 110 has a quadrangular shape, four side panels 140 can be coupled to four side surfaces of the display panel 110, respectively.

The fixing hole 133a is formed at the connector 133 of the back cover 130 disposed adjacent to the side panel 140 such that the fixing hole 133a extends through the connector 133. As an end of the coupler 143 is inserted into the fixing hole 133a, coupling between the side panel 140 and the back cover 130 is achieved. In this case, the coupler 143 preferably includes a coupling head 144 formed at the end of the coupler 143 while having a greater cross-sectional area at the end of the coupler 143 than the size of the fixing hole 133a. For example, the end of the coupler 143 can have a hook shape. Accordingly, the coupler 143 can be coupled to the fixing hole 133a such that, although the coupler 143 is easily inserted into the fixing hole 133a, separation thereof is prevented or interfered with by the fixing hole 133a.

The second panel 142 of the side panel 140 is disposed at an upper surface of the first plate 131. A rear surface edge of the display panel 110 can be coupled to an upper surface of the second panel 142 through bonding or by a double-sided tape 40. Accordingly, the procedure of coupling the side panel 140 and the back cover 130 can be simplified and, as such, an enhancement in assemblability can be provided.

A reinforcing bar 170 can be provided inside the back cover 130.

The reinforcing bar 170 can be additionally inserted into a hollow hole 30 formed in a procedure of extruding the back cover 130 and, as such, rigidity of the back cover 130 can be enhanced. The reinforcing bar 170 can be made of a plastic or metal material having superior rigidity over the back cover 130. Preferably, the reinforcing bar 170 has a quadrangular structure having a hollow cross-section. In accordance with other embodiments associated with the shape of the reinforcing bar 170, the reinforcing bar 170 can selectively have a C-shape, an H-shape, an I-shape, a W-shape, or the like.

FIGS. 7A to 7D are experimental graphs depicting deflection of the back cover according to shapes of the reinforcing bar provided at the back cover, respectively.

Figure 7A:
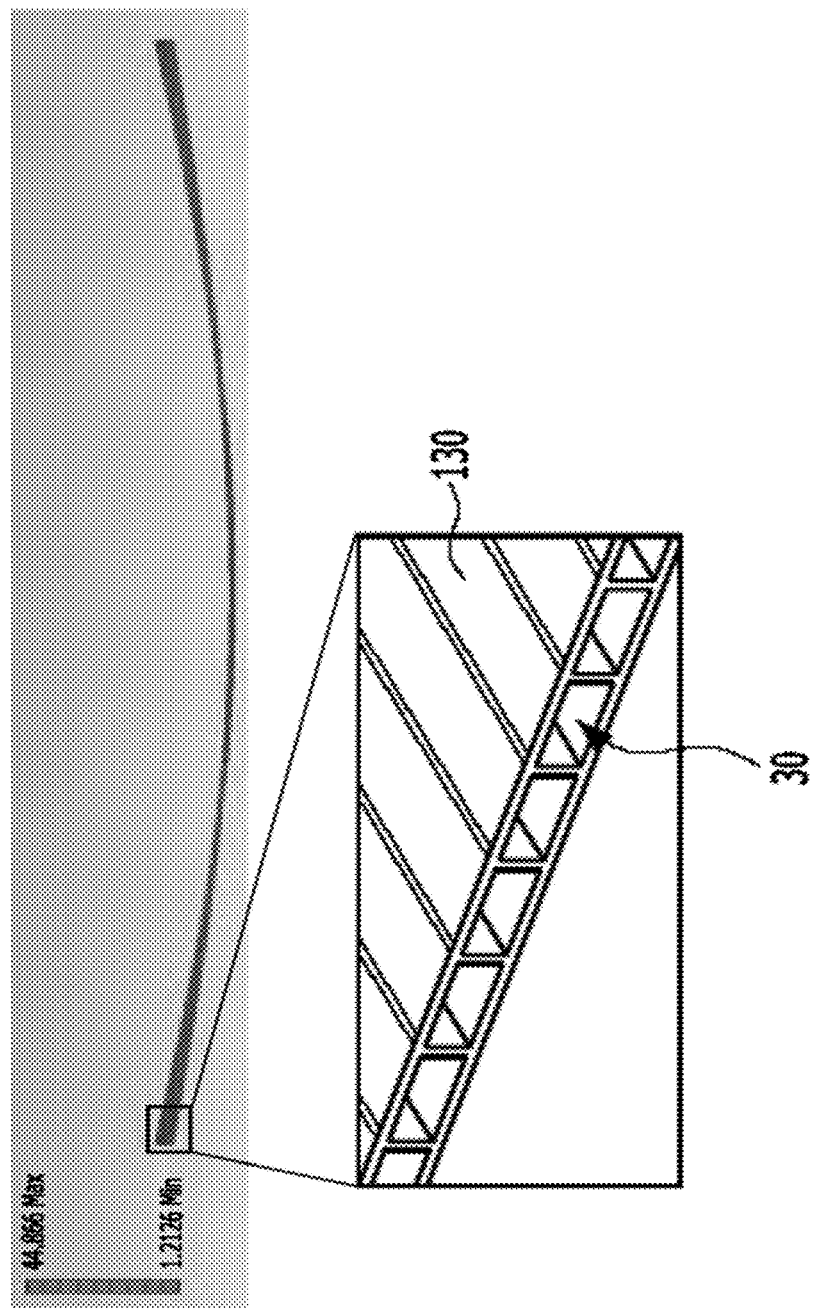
FIGS. 7A to 7D are experimental graphs depicting deflection of the back cover according to shapes of the reinforcing bar provided at the back cover, respectively.
Figure 7B:
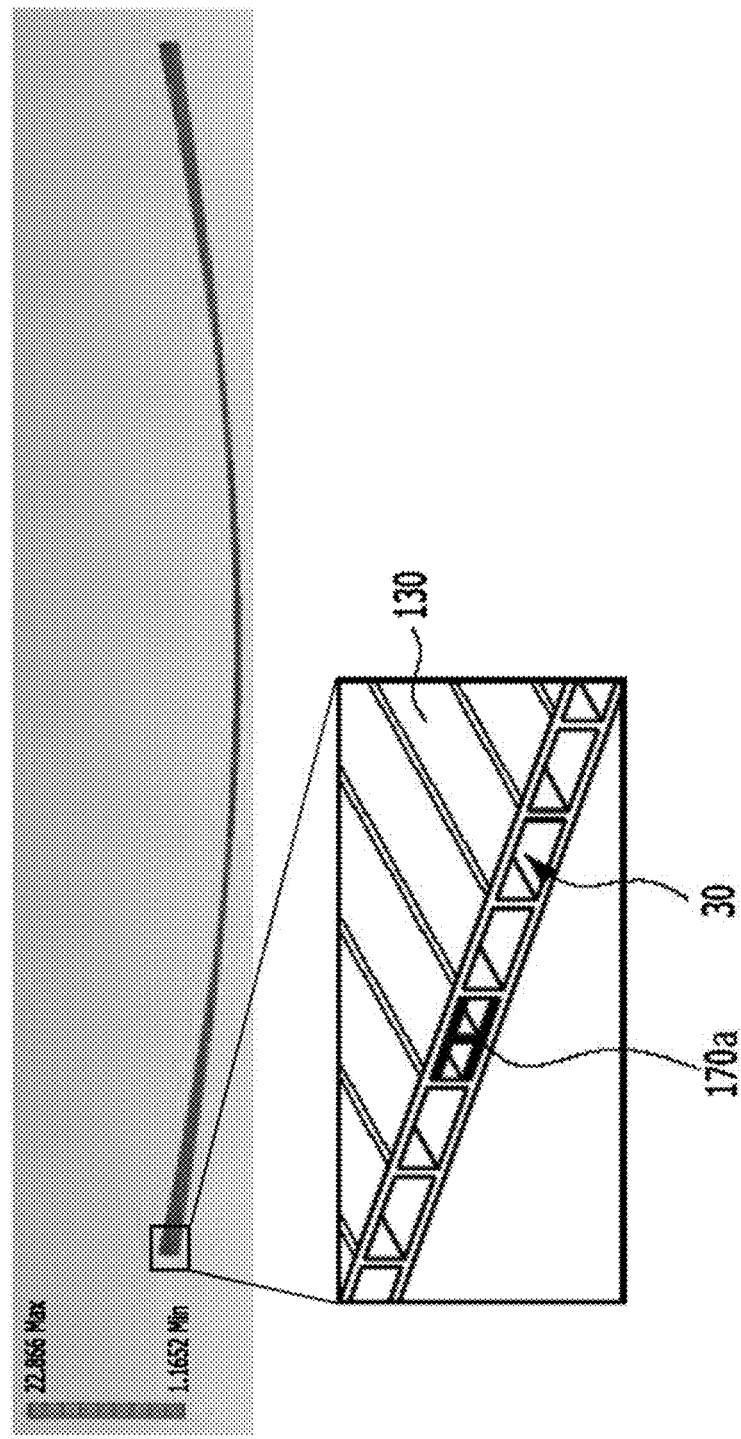
Figure 7C:
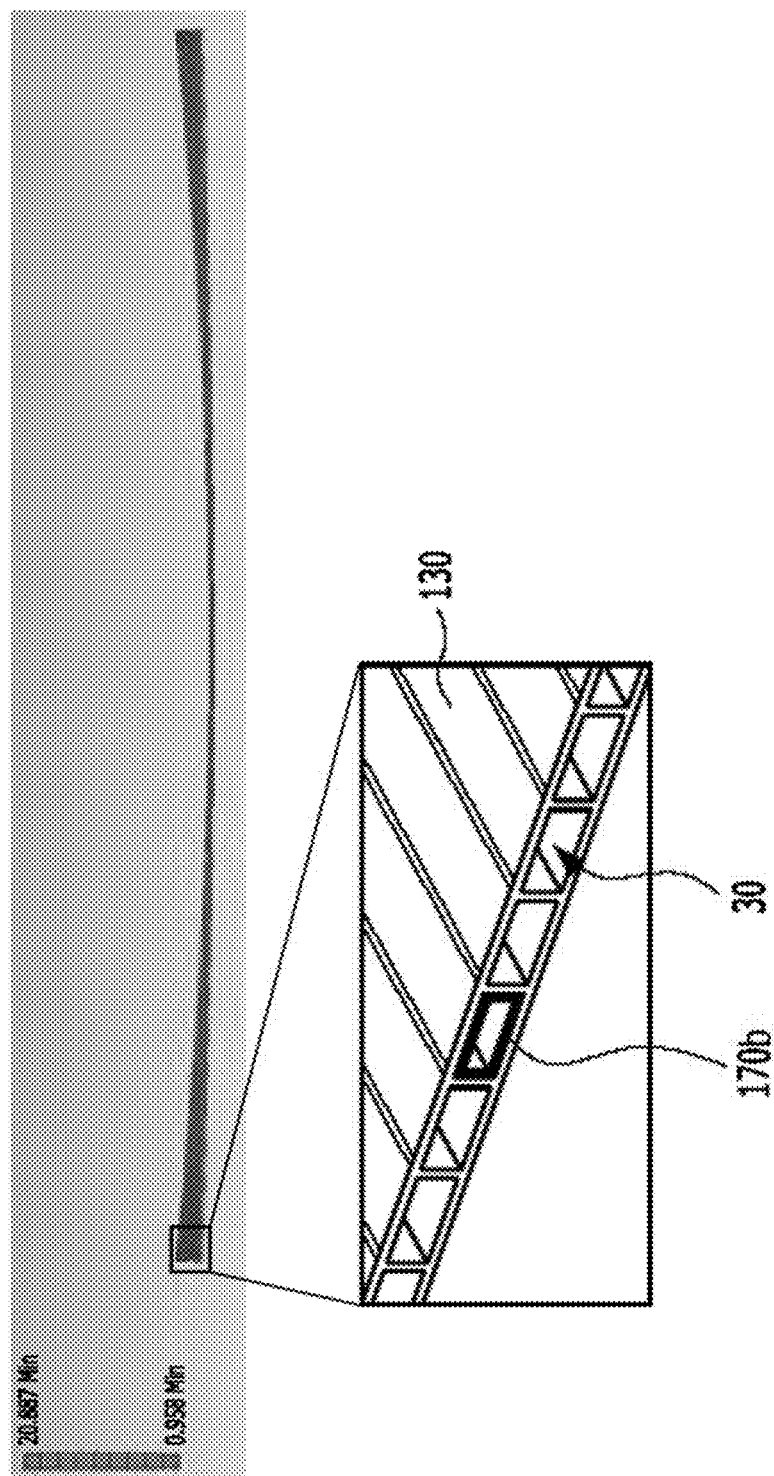
Figure 7D:
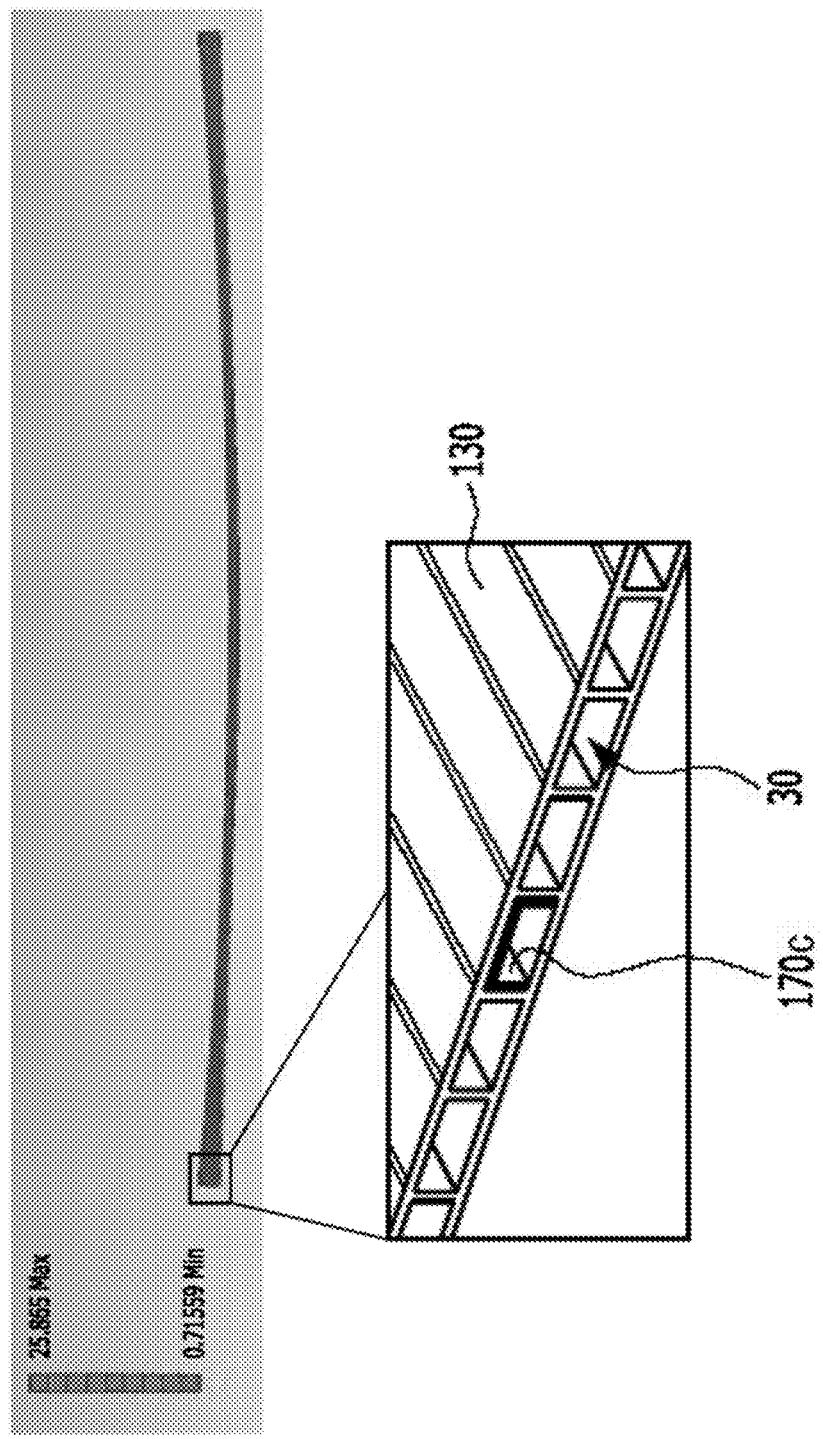

FIG. 7A shows a state in which there is no reinforcing bar in any hollow hole 30 of the back cover 130. FIG. 7B shows a state in which a reinforcing bar 170a having an H-shaped cross-section is inserted into one hollow hole 30 of the back cover 130. FIG. 7C shows a state in which a reinforcing bar 170b having a quadrangular cross-section is inserted into one hollow hole 30 of the back cover 130. FIG. 7D shows a state in which a reinforcing bar 170c having a C-shaped cross-section is inserted into one hollow hole 30 of the back cover 130.

In accordance with experimental results, deflection of the back cover 130 was measured to be about 44.9 mm in the case of FIG. 7A, in which there is no reinforcing bar, 22.9 mm in the case of FIG. 7B, in which the H-shaped reinforcing bar 138a is inserted, 20.9 mm in the case of FIG. 7C, in which the quadrangular reinforcing bar 138b is inserted, and 25.9 mm in the case of FIG. 7D, in which the C-shaped reinforcing bar 138c is inserted. For example, it can be seen that deflection of the back cover 130, into which the quadrangular reinforcing bar 170b is inserted, is lowest. In this case, there is an effect of reducing deflection of the back cover 130 by 50% or more.

Figure 8A:
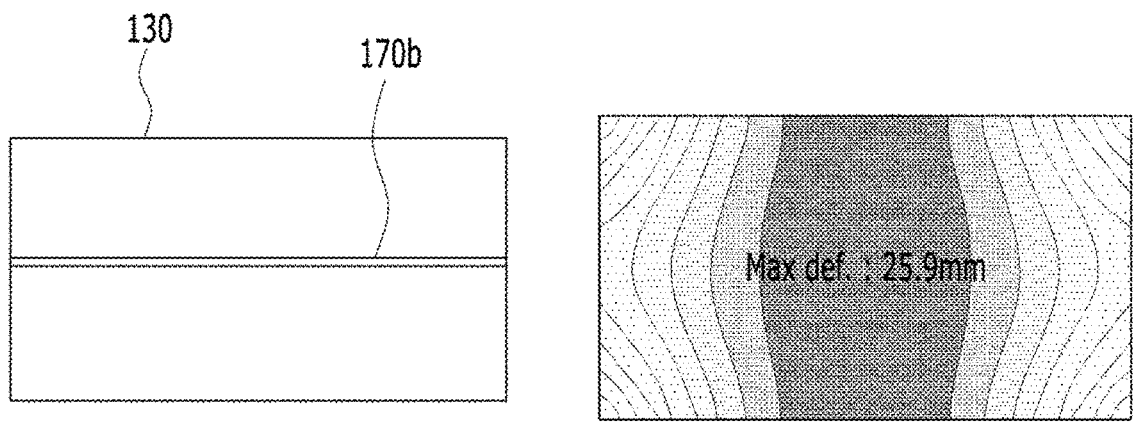
FIGS. 8A to 8C are experimental graphs depicting deflection of the back cover in accordance with different installation positions of reinforcing bars in the present invention, respectively'
Figure 8B:
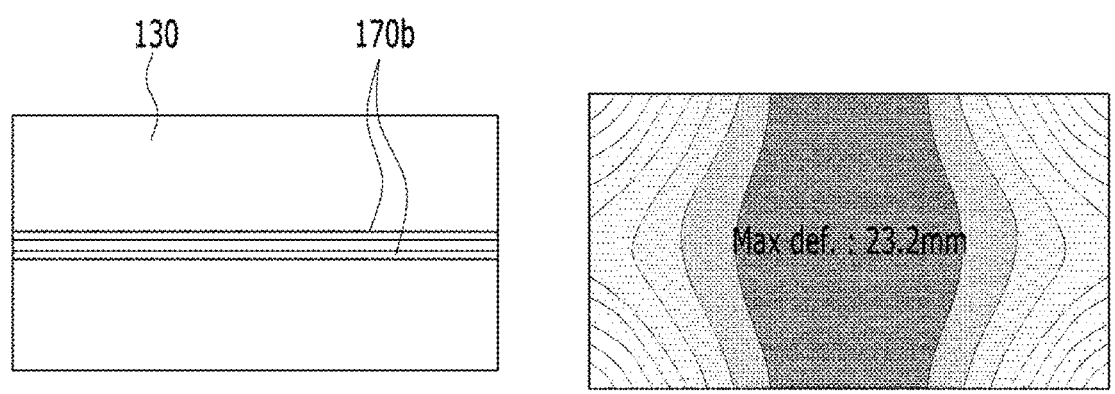
Figure 8C:
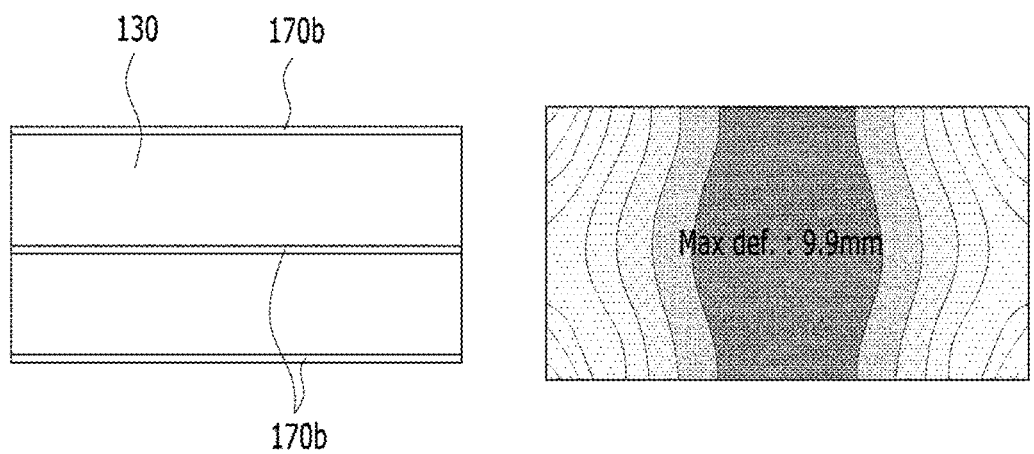

FIGS. 8A to 8C are experimental graphs depicting deflection of the back cover in accordance with different installation positions of reinforcing bars in the present invention, respectively. This experiment is associated with an example in which one or more reinforcing bars 170b having a hollow quadrangular cross-section are applied to the interior of the back cover.

FIG. 8A shows the case in which one reinforcing bar 170b (cf. FIG. 7C) is provided in a central or middle area of the back cover 130. FIG. 8B shows the case in which two reinforcing bars 170b are provided in the middle area of the back cover 130. FIG. 8C shows the case in which reinforcing bars 170b are provided in upper, middle and lower areas of the back cover 130, respectively. The cases of FIGS. 8A to 8C will be described in conjunction with an example in which the reinforcing bar 170b having the quadrangular cross-sectional shape as shown in FIG. 7C is provided. Of course, reinforcing bars having other shapes can also be provided.

In accordance with experimental results, deflection of the back cover 130 in FIG. 8A was measured to be 25.9 mm, deflection of the back cover 130 in FIG. 8B was measured to be 23.2 mm, and deflection of the back cover 130 in FIG. 8C was measured to be 9.9 mm.

For example, when the display device of the present invention is a TV, the display device is used in a state in which the display panel and the back cover are coupled, and are maintained upright. In connection with this, the back cover 130 can be divided into upper, middle and lower areas, and reinforcing bars 170b can be provided in the three areas, respectively. Alternatively, one reinforcing bar 170b can be provided only in the upper area of the back cover 130. Since a circuit unit ("150" in FIG. 9) or a cover shield ("160" in FIG. 9) can be coupled to an area beneath the rear surface of the back cover 130, additional rigidity can be secured.

Accordingly, provision of reinforcing bars 170b can be required in the upper or middle area of the back cover 130.

When only one reinforcing bar 170b is provided in the display device of the present invention, the reinforcing bar 170b is preferably applied only to the upper area of the back cover 130. On the other hand, when two or three reinforcing bars 170b are provided, the reinforcing bars 170b are provided preferably in the upper and middle areas of the back cover 130, most preferably in the upper, middle, lower areas of the back cover 130, respectively.

Figure 9A:
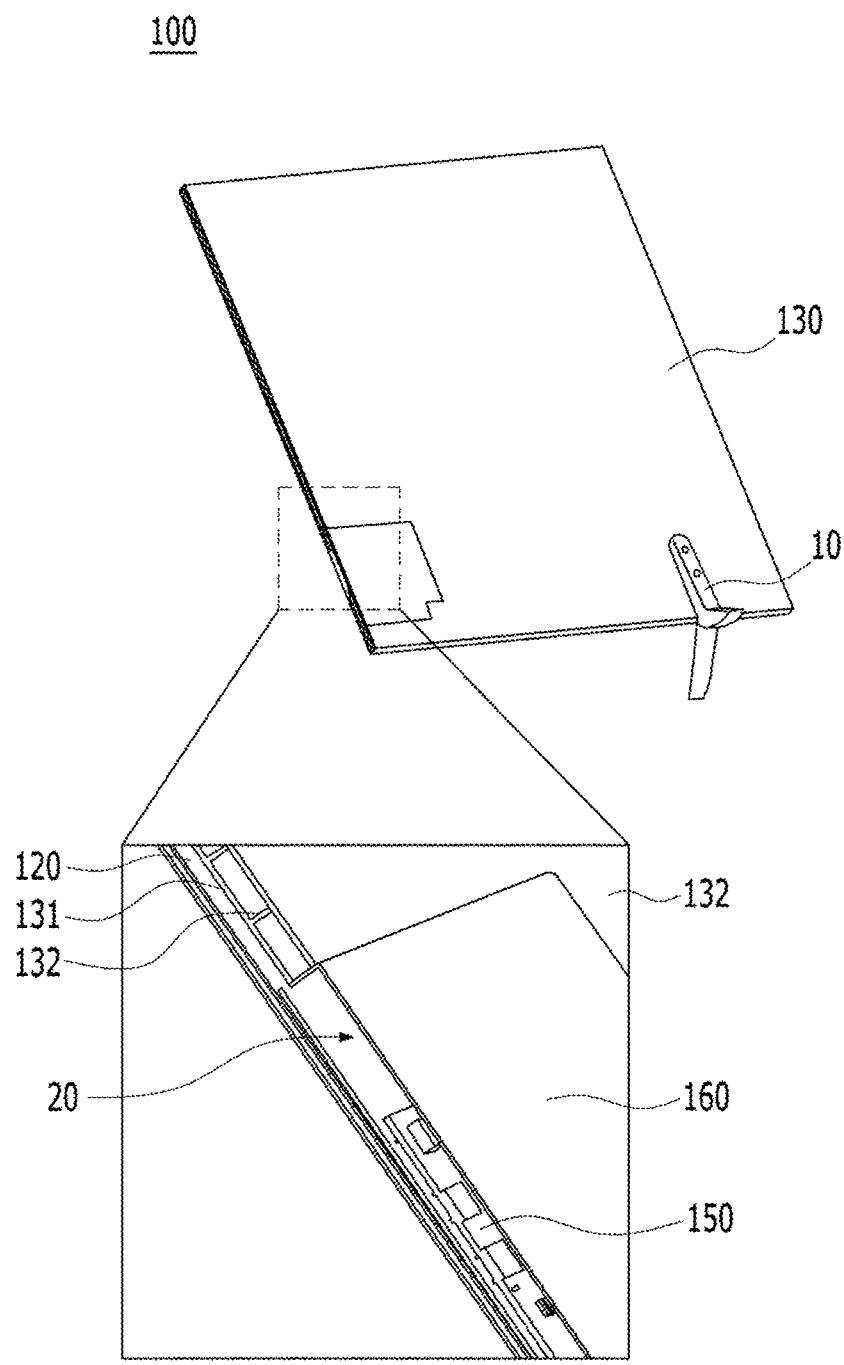
FIG. 9A is an exploded and partially-broken perspective view of the back cover of the display device shown in FIG. 1.
Figure 9B:
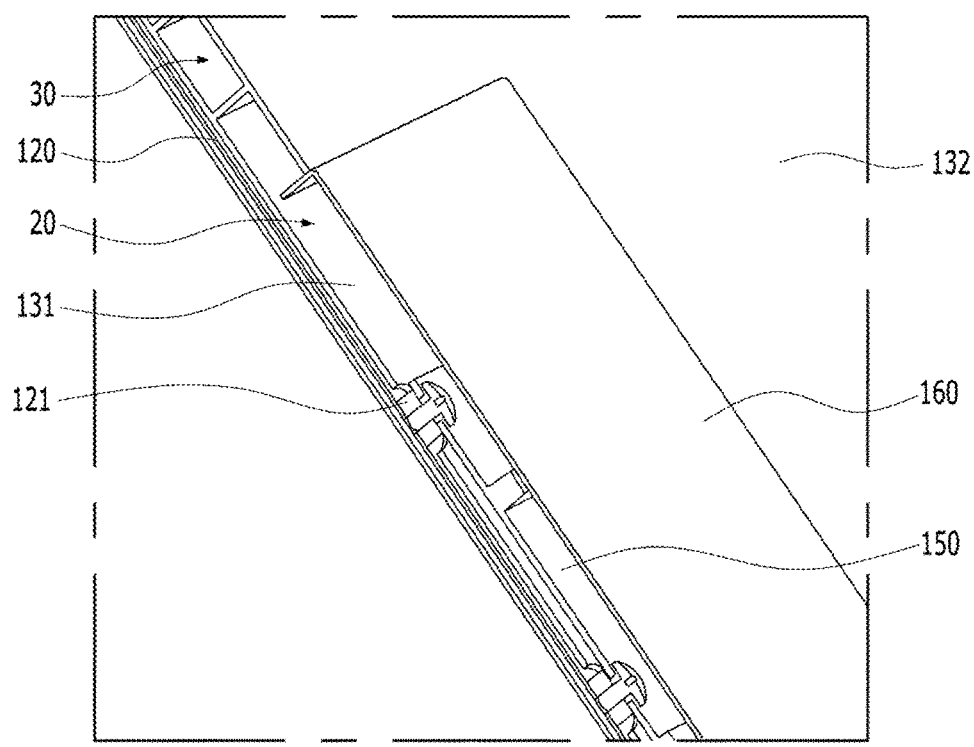
FIGS. 9B and 9C are partially-broken perspective views illustrating a state in which a circuit unit is coupled to the rear surface of the back cover shown in FIG. 9A.
Figure 9C:
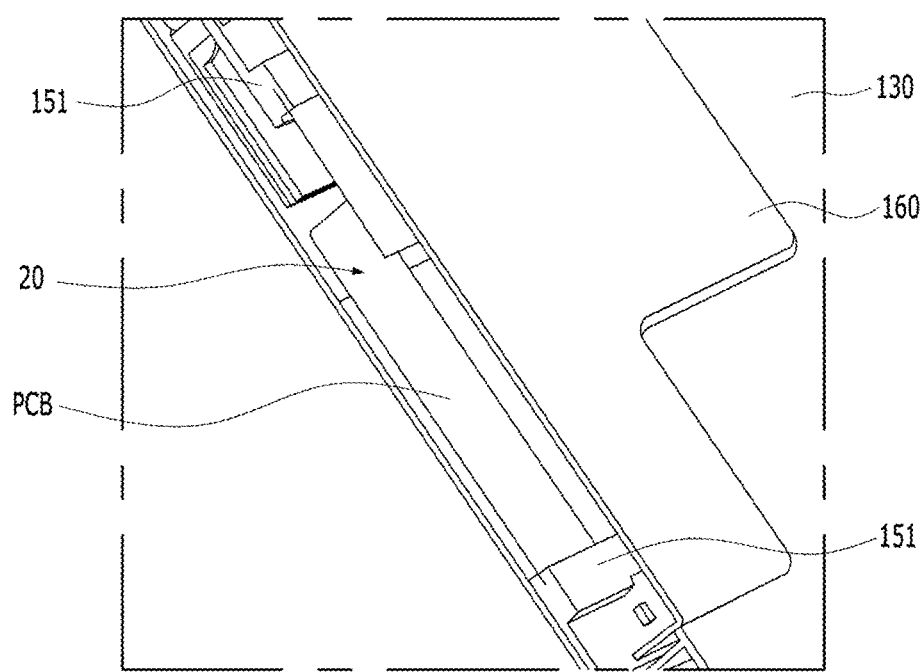

FIG. 9A is an exploded and partially-broken perspective view of the back cover of the display device shown in FIG. 1. FIGS. 9B and 9C are partially-broken perspective views illustrating a state in which a circuit unit is coupled to the rear surface of the back cover shown in FIG. 9A.

Referring to FIGS. 9A to 9C, the back cover 130 of the present invention is extruded in the form of a hollow plate structure and, as such, is constituted by the first plate 131, the second plate 132, and the first connectors 133. In this case, the display panel 110, which is disposed at the upper surface of the first plate 131, should have an area where the circuit unit 150 will be disposed or coupled. In connection with this, when the second plate 132 and the first connectors 133 are partially removed from the rear surface of the back cover 130, or the second plate 132, the first connectors 133 and a reinforcing bar 170 are partially removed from the rear surface of the back cover 130, an installation area 20 for the circuit unit 150 can be secured.

For example, the display panel 110 and the inner plate 120 are coupled to a front surface of the back cover 130 (the upper surface of the first plate), and the circuit unit 150 is disposed at the rear surface of the back cover 130 (the rear surface of the first plate from which the second plate and the first connectors are partially removed). The cover shield 160 can be coupled to the rear surface of the back cover 130 in the area where the circuit unit 150 is installed. The cover shield 160 can be coupled to the rear surface of the back cover 130 in order to cover the area 20 where the circuit unit 150 is installed. The cover shield 160 can be made of a material having superior rigidity over the back cover 130, for an enhancement in rigidity of the back cover 130. Alternatively, a portion of the second plate 132 removed from the area 20, in which the circuit unit 150 is installed, can be re-used to be used as the cover shield 160.

Accordingly, no separate mounting space is required for coupling of the circuit unit 150 to the rear surface of the back cover 130 and, as such, there is an effect of embodying a simple and slim display device.

As illustrated in FIGS. 9B and 9C, the inner plate 120 is disposed at the rear surface of the display panel 110, and the first plate 131 is disposed at the rear surface of the inner plate 120. In this case, fasteners 121 provided at the rear surface of the inner plate 120 are disposed such that at least a portion of each fastener 121 protrudes or extends. For example, the fasteners 121 provided at the rear surface of the inner plate 120 can be exposed to the rear surface of the first plate 131, and the circuit unit 150 can be coupled to the fasteners 121. Accordingly, coupling force of the back cover 130 can be enhanced through coupling of the inner plate 120 and the circuit unit 150. As the inner plate 120 and the circuit unit 150 are coupled, there is an effect of achieving an enhancement in heat dissipation performance.

A printed circuit board (PCB) substrate connected to the circuit unit 150 or a connector 151 configured to connect the PCB substrate and the circuit unit 150 can be received in the circuit unit installation area 20.

Figure 10:
FIG. 10 is a reference view illustrating characteristics of the back cover of the present invention in an extrusion direction.

FIG. 10 is a reference view illustrating characteristics of the back cover of the present invention in an extrusion direction.

The back cover 130 can be formed through plastic extrusion molding. In this case, characteristics of the back cover 130 can be varied in accordance with an extrusion direction and an application direction of the back cover 130.

For example, when a back cover extruded in an x-axis direction is coupled to a display device extending lengthily in a horizontal direction (x-axis direction), as in a TV, it can be possible to enhance rigidity in the horizontal direction of the display device, that is, the x-axis direction, because the connectors 133 are formed in the x-axis direction inside the back cover 130. In other words, when the extrusion direction of the back cover 130 is applied to correspond to the horizontal direction of the display device, deflection rigidity can be enhanced. Referring to FIG. 10, in accordance with deflection analysis results, deflection of the back cover 130 extruded in the horizontal direction is 44.8 mm, and is small, as compared to deflection of the back cover 130 extruded in the vertical direction, that is, 47.4 mm.

On the other hand, when a back cover 130 extruded in a y-axis direction perpendicular to the x-axis direction is coupled to a display device extending lengthily in the horizontal direction (x-axis direction), it can be possible to enhance heat dissipation performance in a vertical direction of the display device, that is, the y-axis direction, because connectors are formed in the y-axis direction inside the back cover 130. For example, when the extrusion direction of the back cover 130 is applied to correspond to the vertical direction of the display device, a heat dissipation effect can be enhanced because convection is smoothly carried out through hollow holes ("20" in FIG. 2). Referring to FIG. 10, in accordance with temperature analysis results, the case in which only the back cover 130 extruded in the vertical direction is coupled to the display panel exhibits 88.7° C., and is lower than the temperature exhibited in the case in which only the back cover 130 extruded in the horizontal direction is coupled to the display panel, that is, 94.0° C. Even in the case in which, in addition to the back cover 130 extruded in the vertical direction, the inner plate is coupled to the display panel, the back cover 130 exhibits 51.1° C. and is lower than the temperature exhibited by the back cover 130 extruded in the horizontal direction in the case in which, in addition to the back cover 130, the inner plate is coupled to the display panel, that is, 51.9° C.

Although the display device according to the present invention has been described in conjunction with the example to which a back cover extruded in a horizontal direction is applied, for attachment of importance to rigidity enhancement, a back cover extruded in a vertical direction can also be applied, taking into consideration heat dissipation characteristics.

As apparent from the above description, in accordance with the present invention, it can be possible to embody a display device having a light and thin structure through application of a back cover formed through plastic extrusion molding. A reinforcing bar can be provided in a hollow hole of the back cover and, as such, additional rigidity enhancement can be achieved. As a fastening structure can be applied between back covers, a multi-display device can be realized. Through improvement of a coupling structure of a side panel, there is an effect of enhancing assemblability.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A display device comprising:
a display panel;
an inner plate disposed at a rear surface of the display panel; and
a back cover disposed at a rear surface of the inner plate, wherein the back cover comprises:
   a first plate disposed on the rear surface of the inner plate,
   a second plate spaced apart from the first plate so that the second plate faces the first plate,
   a plurality of first connectors connecting the first plate and the second plate,
   a plurality of hollow holes formed between the first plate, the second plate, and the first connectors, and
   a reinforcing bar removably inserted only into one hollow hole or some hollow holes among the plurality of hollow holes,
wherein the display device further comprises:
   a side panel configured to cover an outer end of the back cover and an outer end of the display panel, and
wherein the side panel comprises:
   a first panel forming an external portion of the display device and disposed at side surfaces of the back cover and the display panel,
   a second panel bonded to the display panel and an upper surface of the back cover while protruding from the first panel,
   a coupler protruding from the first panel so that the coupler is inserted into a fixing hole formed at one of the first connectors, and
   a coupling head formed at an end of the coupler to have a size greater than a size of the fixing hole.

2. The display device according to claim 1, wherein the back cover further comprises a second connector connecting the first plate and the second plate or connecting the first connectors, and
   the back cover is formed through extrusion molding so that the first plate, the second plate, the first connectors and the second connector are integrally formed.

3. The display device according to claim 2, wherein the first connectors and the second connector are connected by one or more of a plurality of patterns having at least one structure of "I", "H", "N", "V", "X" or a honeycomb between the first plate and the second plate.

4. The display device according to claim 1, wherein the back cover comprises an extension extending from one end of the back cover along a side surface of the display panel.

5. The display device according to claim 1, wherein:
   the back cover comprises a first back cover and a second back cover coupled to each other in a horizontal direction; and
   the first back cover is provided with a protrusion protruding from one lateral end of the first back cover, and the second back cover is formed with a groove at one lateral end of the second back cover facing the lateral end of the first back cover so that the protrusion is coupled to the groove.

6. The display device according to claim 1, wherein:
   the back cover comprises a first back cover and a second back cover coupled to each other in a horizontal direction;
   the first back cover is provided with a first protrusion at one end of a rear surface of the first back cover, and the second back cover is provided with a second protrusion at one end of a rear surface of the second back cover so that the second protrusion faces the first protrusion; and
   the back cover further comprises a fastener configured to simultaneously fasten the first protrusion and the second protrusion.

7. The display device according to claim 1, wherein the back cover further comprises a circuit unit installation area from which the second plate and a part of the first connectors are removed, in order to enable a circuit unit of the display panel to be coupled to a rear surface of the first plate.

8. The display device according to claim 7, further comprising:
   a cover shield coupled to a rear surface of the back cover to cover the circuit unit installation area.

9. The display device according to claim 8, wherein the circuit unit is coupled to a fastener extending through the first plate at the rear surface of the inner plate.

10. The display device according to claim 1, wherein a material of the reinforcing bar is different from a material of each of the first plate, the second plate, and the first connectors.

11. The display device according to claim 1, wherein a material of the reinforcing bar has a higher rigidity than a material of each of the first plate, the second plate, and the first connectors.

* * * * *